(12) United States Patent
Tamura

(10) Patent No.: US 12,198,906 B2
(45) Date of Patent: Jan. 14, 2025

(54) SUBSTRATE SUPPORT AND PLASMA PROCESSING APPARATUS

(71) Applicant: TOKYO ELECTRON LIMITED, Tokyo (JP)

(72) Inventor: Hajime Tamura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 135 days.

(21) Appl. No.: 17/036,943

(22) Filed: Sep. 29, 2020

(65) Prior Publication Data

US 2021/0098239 A1     Apr. 1, 2021

(30) Foreign Application Priority Data

Oct. 1, 2019   (JP) .................. 2019-181574

(51) Int. Cl.
*H01J 37/32*     (2006.01)
*H01L 21/683*    (2006.01)
*H01L 21/687*    (2006.01)

(52) U.S. Cl.
CPC .. *H01J 37/32715* (2013.01); *H01J 37/32541* (2013.01); *H01J 37/32577* (2013.01);
(Continued)

(58) Field of Classification Search
CPC ........... H01J 37/32091; H01J 37/32174; H01J 37/32183; H01J 37/32366; H01J 37/32385; H01J 37/32422; H01J 37/32431; H01J 37/32458; H01J 37/32467; H01J 37/32477–32504; H01J 37/32522; H01J 37/32532–32559; H01J 37/32577; H01J 37/32605; H01J 37/32623–32651; H01J 37/32697; H01J 37/32706; H01J 37/32715; C23C 16/458–4583; C23C 16/4585; C23C 16/4586; H01L 21/68714; H01L 21/68735; H01L 21/68785; H01L 21/6833
See application file for complete search history.

(56) References Cited

U.S. PATENT DOCUMENTS 8,193,629 B2 * 6/2012 Takebayashi ....... H01L 21/6833
                                                         219/544
8,334,481 B2 * 12/2012 Komatsu ........... H01L 21/67103
                                                         219/390
(Continued)

FOREIGN PATENT DOCUMENTS

JP      2007-258608 A    10/2007
JP      2008-135737 A     6/2008
(Continued)

*Primary Examiner* — Kurt Sweely
(74) *Attorney, Agent, or Firm* — XSENSUS LLP

(57) ABSTRACT

A substrate support includes a substrate supporting surface, an electrode, a power supply line, and a power supply terminal. The electrode is disposed below the substrate supporting surface and configured to provide a bias power. The power supply line is disposed below the electrode and configured to apply the bias power to the electrode. The power supply terminal is configured to electrically couple the electrode and the power supply line. Further, an area of a surface of the power supply terminal that is coupled to the electrode is greater than an area of a surface of the power supply terminal that is coupled to the power supply line.

17 Claims, 6 Drawing Sheets

(52) U.S. Cl.
CPC .... *H01J 37/32642* (2013.01); *H01L 21/6833* (2013.01); *H01L 21/68735* (2013.01); *H01J 37/32091* (2013.01)

(56) References Cited

U.S. PATENT DOCUMENTS

| | | | | |
|---|---|---|---|---|
| 8,894,806 | B2* | 11/2014 | Koshimizu | H01J 37/32091 118/728 |
| 2003/0066608 | A1* | 4/2003 | Natsuhara | H01J 37/32009 156/345.43 |
| 2004/0119552 | A1* | 6/2004 | Wray | H01P 1/26 333/22 R |
| 2008/0190364 | A1* | 8/2008 | Mahon | H01L 21/6831 134/1.1 |
| 2014/0315392 | A1* | 10/2014 | Xu | H01J 37/32477 428/685 |
| 2015/0311105 | A1* | 10/2015 | Sadjadi | H01L 21/0228 438/798 |
| 2017/0018411 | A1* | 1/2017 | Sriraman | H01J 37/32642 |
| 2017/0053820 | A1* | 2/2017 | Bosch | H01L 21/6833 |
| 2018/0151402 | A1* | 5/2018 | Noorbakhsh | H01L 21/68785 |
| 2018/0182635 | A1* | 6/2018 | Tsukahara | C23C 16/4585 |
| 2020/0043703 | A1* | 2/2020 | French | H01L 21/6833 |
| 2020/0266088 | A1* | 8/2020 | Kosakai | H01L 21/3065 |

FOREIGN PATENT DOCUMENTS

| | | |
|---|---|---|
| JP | 2011-035266 A | 2/2011 |
| JP | 2011119654 A | 6/2011 |
| JP | 2018-110216 A | 7/2018 |
| WO | 2019065233 A1 | 4/2019 |

\* cited by examiner

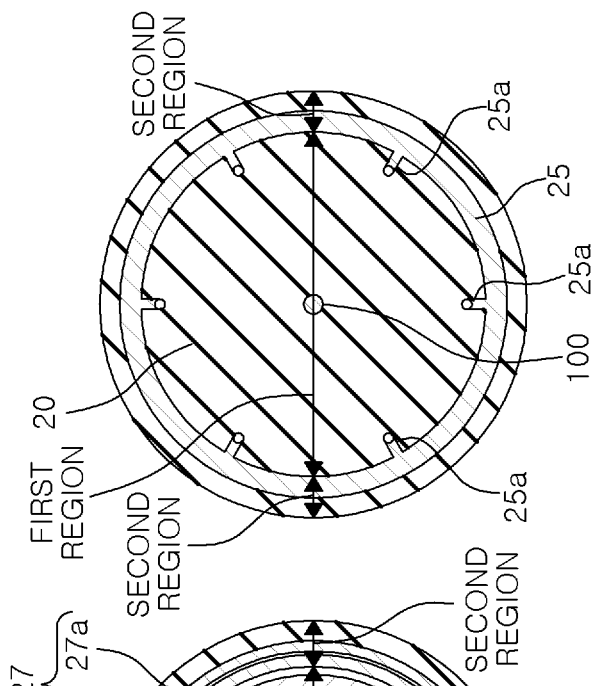
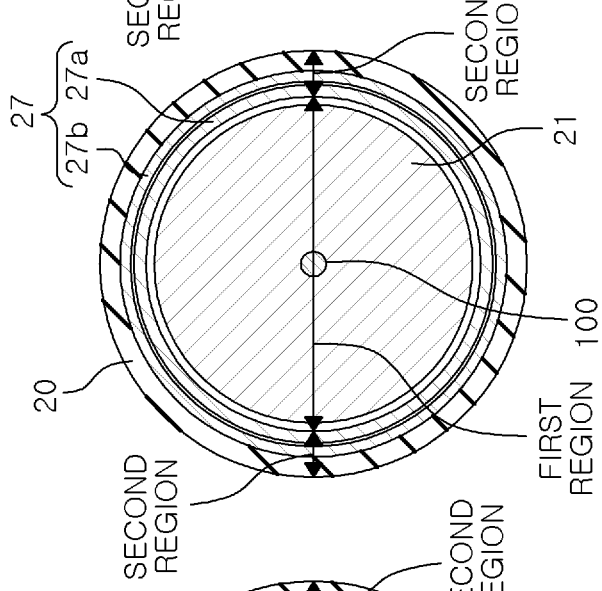
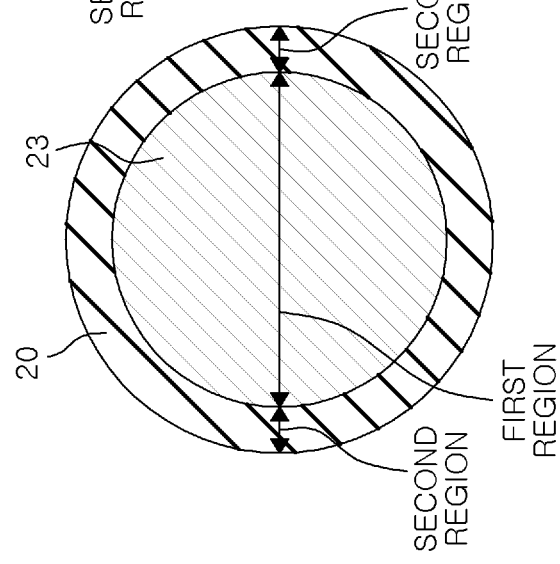

SUBSTRATE SUPPORT AND PLASMA PROCESSING APPARATUS

CROSS-REFERENCE TO RELATED APPLICATIONS

This application claims priority to Japanese Patent Application No. 2019-181574, filed on Oct. 1, 2019, the entire contents of which are incorporated herein by reference.

TECHNICAL FIELD

The present disclosure relates to a substrate support and a plasma processing apparatus.

BACKGROUND

An electrostatic chuck and an edge ring (also referred to as "focus ring") are placed on a substrate supporting surface of a substrate support of a plasma processing apparatus. An attracting electrode, an electrode for providing a bias power, a heater, or the like may be embeded in each of the electrostatic chuck and the edge ring. For example, Japanese Patent Application Publication No. 2018-110216 discloses a cylindrical contact structure coupled to an electrode as a power supply terminal.

When a current flows through the power supply terminal, heat is generated at a contact portion, which may result in a non-uniform temperature distribution of a substrate.

The present disclosure provides a technique capable of improving in-plane uniformity of a substrate temperature.

SUMMARY

In accordance with an aspect of the present disclosure, there is provided a substrate support including: a substrate supporting surface; at least one electrode disposed below the substrate supporting surface and configured to provide a bias power; a power supply line disposed below the electrode and configured to apply the bias power to the electrode; and one or more power supply terminals configured to electrically couple the electrode and the power supply line, wherein an area of a surface of each of the power supply terminals that is coupled to the electrode is greater than an area of a surface of each of the power supply terminals that is coupled to the power supply line.

BRIEF DESCRIPTION OF THE DRAWINGS

The objects and features of the present disclosure will become apparent from the following description of embodiments, given in conjunction with the accompanying drawings, in which:

FIGS. 6A to 6C show a VIA-VIA cross section, a VIB-VIB cross section, and a VIC-VIC cross section of the substrate support according to the embodiment, respectively.

DETAILED DESCRIPTION

Figure 1:
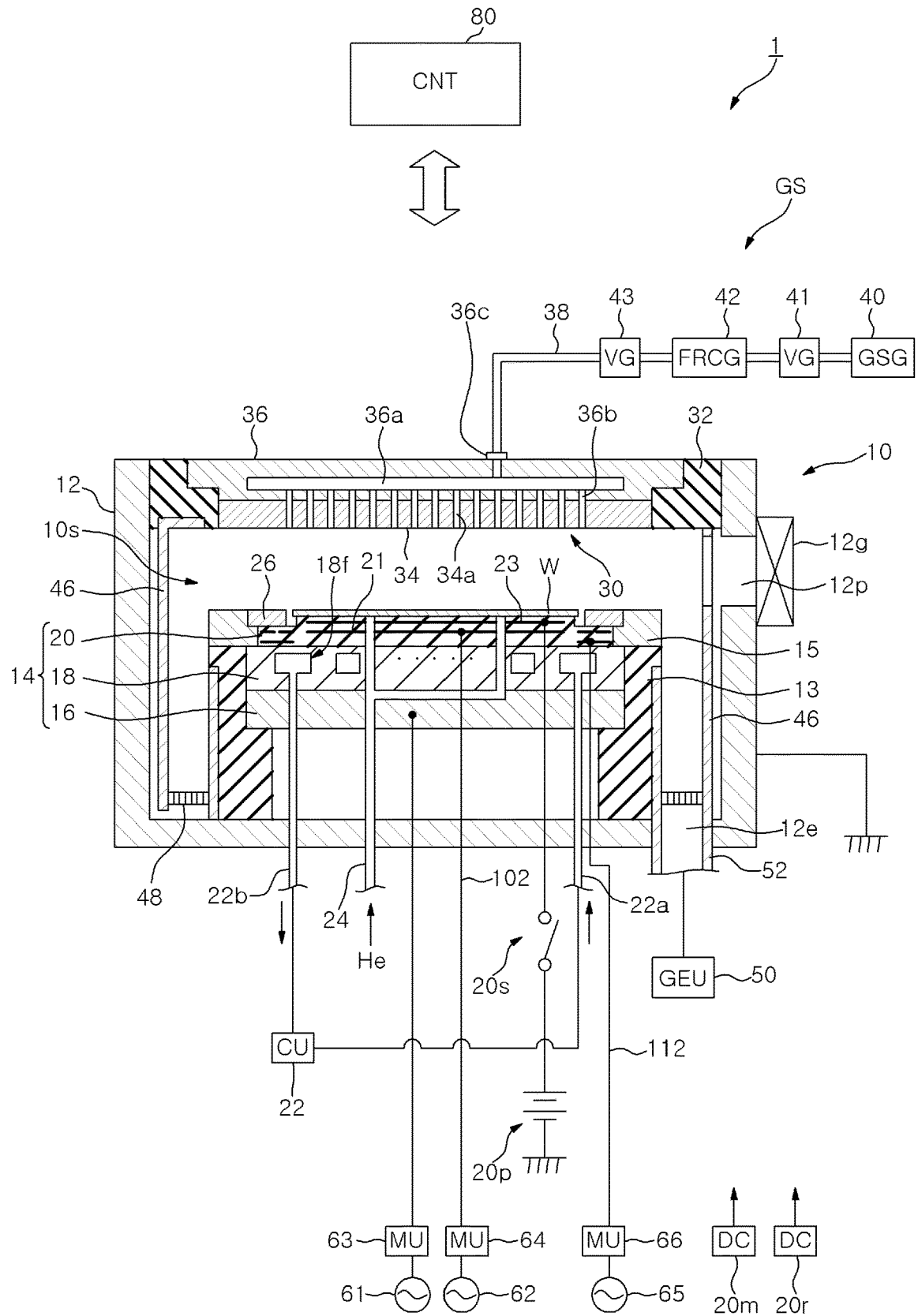
FIG. 1 is a schematic cross-sectional view showing an example of a plasma processing apparatus according to an embodiment.

Hereinafter, embodiments of the present disclosure will be described in detail with reference to the accompanying drawings. Like reference numerals will be given to like or corresponding parts throughout the drawings and redundant description thereof will be omitted.

(Plasma Processing Apparatus)

FIG. 1 schematically shows a plasma processing apparatus 1 according to an embodiment. The plasma processing apparatus 1 shown in FIG. 1 is a capacitively coupled plasma processing apparatus. The plasma processing apparatus 1 includes a chamber 10. The chamber 10 has an inner space 10s therein.

The chamber 10 includes a chamber body 12. The chamber body 12 has a substantially cylindrical shape and has the inner space 10s therein. The chamber body 12 is formed of, for example, aluminum. A corrosion resistant film is formed on an inner wall surface of the chamber body 12. The corrosion resistant film may be a film made of ceramic such as aluminum oxide or yttrium oxide.

The chamber body 12 has a sidewall having a port 12p. A substrate W is transferred between the inner space 10s and the outside of the chamber 10 through the port 12p. The port 12p can be opened and closed by a gate valve 12g disposed on the sidewall of the chamber body 12.

A support 13 is disposed on the bottom of the chamber body 12. The support 13 is formed of an insulating material and has a substantially cylindrical shape. In the inner space 10s, the support 13 extends upward from the bottom of the chamber body 12. A member 15 is disposed on the support 13. The member 15 may be made of an insulating material such as quartz. The member 15 may be an annular plate-shaped body.

The plasma processing apparatus 1 further includes a substrate support 14 according to an exemplary embodiment. The substrate support 14 is disposed in the inner space 10s and supported by the support 13. The substrate support 14 is configured to support the substrate W in the chamber 10, i.e., in the inner space 10s.

The substrate support 14 includes a lower electrode 18 and an electrostatic chuck (ESC) 20 according to an exemplary embodiment. The substrate support 14 may further include an electrode plate 16. The electrode plate 16 is formed of a conductor such as aluminum and has a substantially disk shape. The lower electrode 18 is disposed on the electrode plate 16. The lower electrode 18 is formed of a conductor such as aluminum (Al) or titanium (Ti) and has a substantially disk shape. The lower electrode 18 is electrically coupled to the electrode plate 16. An outer peripheral surface of the lower electrode 18 and an outer peripheral surface of the electrode plate 16 are surrounded by the support 13. The electrode plate 16 and the lower electrode 18 are an example of a base that supports the electrostatic chuck 20.

The electrostatic chuck 20 is disposed on the lower electrode 18. An edge of the electrostatic chuck 20 and an edge ring 26 are surrounded by the member 15. The electrostatic chuck 20 supports the substrate W and the edge ring 26 according to an exemplary embodiment.

The substrate W has, e.g., a disk shape and is placed onto the electrostatic chuck 20. The edge ring 26 is placed onto the electrostatic chuck 20 to surround an edge of the substrate W. An outer edge portion of the edge ring 26 may extend to be positioned above an inside edge of the member 15. The edge ring 26 is an annular member. The edge ring 26 may be formed of, but not limited to, silicon, silicon carbide, or quartz. The edge ring 26 is also referred to as a "focus ring."

The lower electrode 18 has an internal flow channel 18*f*. A heat exchange medium (e.g., a coolant) is supplied to the internal flow channel 18*f* from a chiller unit (CU) 22 through a line 22*a*. The chiller unit 22 is disposed external to the chamber 10. The heat exchange medium supplied to the internal flow channel 18*f* returns to the chiller unit 22 through a line 22*b*. In the plasma processing apparatus 1, a temperature of the substrate W placed on the electrostatic chuck 20 is adjusted by heat exchange between the heat exchange medium and the lower electrode 18.

The plasma processing apparatus 1 further includes a gas supply line 24. The gas supply line 24 is provided to supply a heat transfer gas (e.g., He gas) from a heat transfer gas supply mechanism to a space between an upper surface of the electrostatic chuck 20 and a back surface of the substrate W.

The plasma processing apparatus 1 further includes an upper electrode 30. The upper electrode 30 is disposed above the substrate support 14. The upper electrode 30 is supported at an upper portion of the chamber body 12 with a member 32. The member 32 is formed of an insulating material. The upper electrode 30 and the member 32 close a top opening of the chamber body 12.

The upper electrode 30 may include a ceiling plate 34 and a holder 36. A bottom surface of the ceiling plate 34 that faces the inner space 10*s* defines the inner space 10*s*. The ceiling plate 34 may be formed of a semiconductor or a low-resistance conductor with low Joule heating. The ceiling plate 34 has multiple gas injection holes 34*a* extending therethrough in a thickness direction (vertical direction).

The holder 36 detachably holds the ceiling plate 34. The holder is formed of a conductive material such as aluminum. The holder 36 has an internal gas diffusion space 36*a*. Multiple gas holes 36*b* are formed in the holder 36. The gas holes 36*b* extend downward from the gas diffusion space 36*a*. The gas holes 36*b* communicate with the gas injection holes 34*a*, respectively. The holder 36 has a gas inlet port 36*c*. The gas inlet port 36*c* is connected to the gas diffusion space 36*a*. A gas supply line 38 is connected to the gas inlet port 36*c*.

The gas supply line 38 is connected to a gas supply unit GS. The gas supply unit GS includes a gas source group (GSG) 40, a valve group (VG) 41, a flow rate controller group (FRCG) 42, and a valve group (VG) 43. The gas source group 40 is connected to the gas supply line 38 through the valve group 41, the flow rate controller group 42, and the valve group 43. The gas source group 40 includes multiple gas sources. Each of the valve group 41 and the valve group 43 includes multiple opening/closing valves. The flow rate controller group 42 includes multiple flow rate controllers. Each of the flow rate controllers of the flow rate controller group 42 is a mass flow controller or a pressure control type flow rate controller. The gas sources of the gas source group 40 are connected to the gas supply line 38 through the corresponding opening/closing valves of the valve group 41, the corresponding flow rate controllers of the flow rate controller group 42, and the corresponding opening/closing valves of the valve group 43.

In the plasma processing apparatus 1, a shield 46 is detachably disposed and extends along an inner wall surface of the chamber body 12. The shield 46 is also disposed on an outer peripheral surface of the support 13. The shield 46 prevents reaction products such as etching by-products or the like from being adhered to the chamber body 12. The shield 46 is obtained by forming a corrosion resistant film on a surface of an aluminum base, for example. The corrosion resistant film may be a film made of ceramic such as yttrium oxide.

A baffle plate 48 is disposed between the support 13 and the sidewall of the chamber body 12. The baffle plate 48 may be obtained by forming a corrosion resistant film on a surface of an aluminum base, for example. The corrosion resistant film may be a film made of ceramic such as yttrium oxide. The baffle plate 48 has multiple through-holes. At the bottom portion of the chamber body 12, a gas exhaust port 12*e* is disposed below the baffle plate 48. A gas exhaust unit (GEU) 50 is connected to the gas exhaust port 12*e* through a gas exhaust line 52. The gas exhaust unit 50 includes a pressure control valve, and a vacuum pump such as a turbo molecular pump.

The plasma processing apparatus 1 further includes a first radio frequency (RF) power supply 61 for applying a RF power HF for plasma generation. The first RF power supply 61 is configured to generate the RF power HF in order to generate plasma from a gas in the chamber 10. The RF power HF has a frequency ranging from, e.g., 27 MHz to 100 MHz.

The first RF power supply 61 is electrically coupled to the lower electrode 18 through a matching unit (MU) 63. The matching unit 63 has a matching circuit configured to match an impedance of a load side (the lower electrode side) of the first RF power supply 61 and an output impedance of the first RF power supply 61. Alternatively, in other embodiments, the first RF power supply 61 may be electrically coupled to the upper electrode 30 through the matching unit 63.

The plasma processing apparatus 1 may further include a second RF power supply 62 for applying RF power LF for ion attraction. The second RF power supply 62 is configured to generate the RF power LF. The RF power LF has a frequency mainly suitable for attracting ions to the substrate W, e.g., a frequency ranging from 400 kHz to 13.56 MHz. Alternatively, the RF power LF may be a pulse-shaped voltage having a rectangular waveform.

The second RF power supply 62 is electrically coupled, through a matching unit (MU) 64, to a bias electrode 21 in the electrostatic chuck 20 that is connected to a power supply line 102. The matching unit 64 has a matching circuit configured to match an impedance of a load side (lower electrode side) of the second RF power supply 62 and an output impedance of the second RF power supply 62.

The plasma processing apparatus 1 further includes a controller (CNT) 80. The controller 80 may be a computer including a processor, a storage device such as a memory, an input device, a display device, a signal input/output interface, and the like, and controls the individual components of the plasma processing apparatus 1. In the controller 80, an operator can input commands through the input device to manage the plasma processing apparatus 1. Further, in the controller 80, the display can visualize and display an operation status of the plasma processing apparatus 1. A control program and recipe data are stored in the storage device of the controller 80. The control program is executed by the processor of the controller 80 to perform various processes in the plasma processing apparatus 1. When the processor of the controller 80 executes the control program and controls the individual components of the plasma processing apparatus 1 based on the recipe data, various processes such as plasma processing and the like are performed in the plasma processing apparatus 1.

(Substrate Support)

Figure 2:
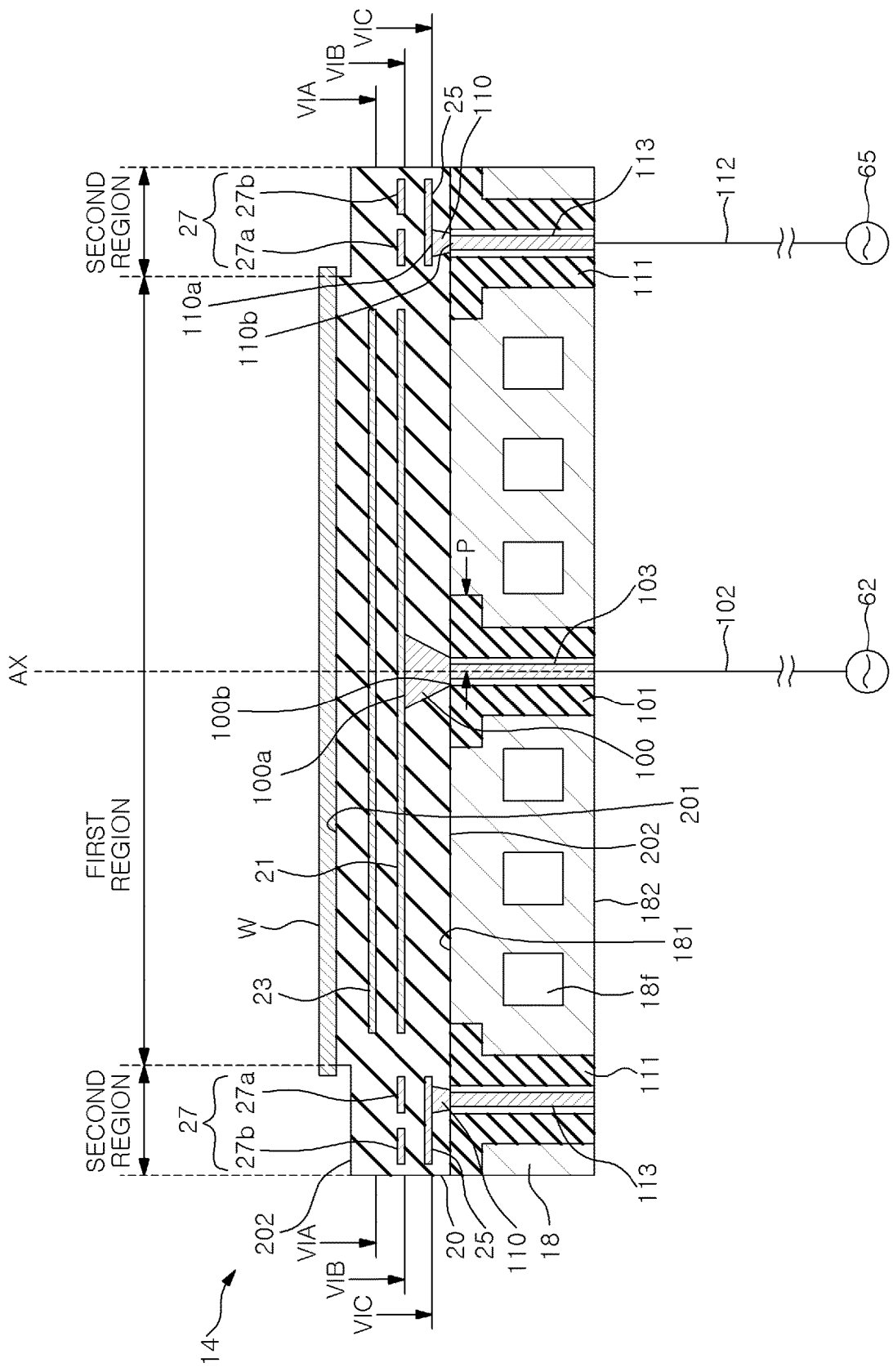
FIG. 2 shows an example of a structure of a substrate support according to an embodiment.
Figure 3:
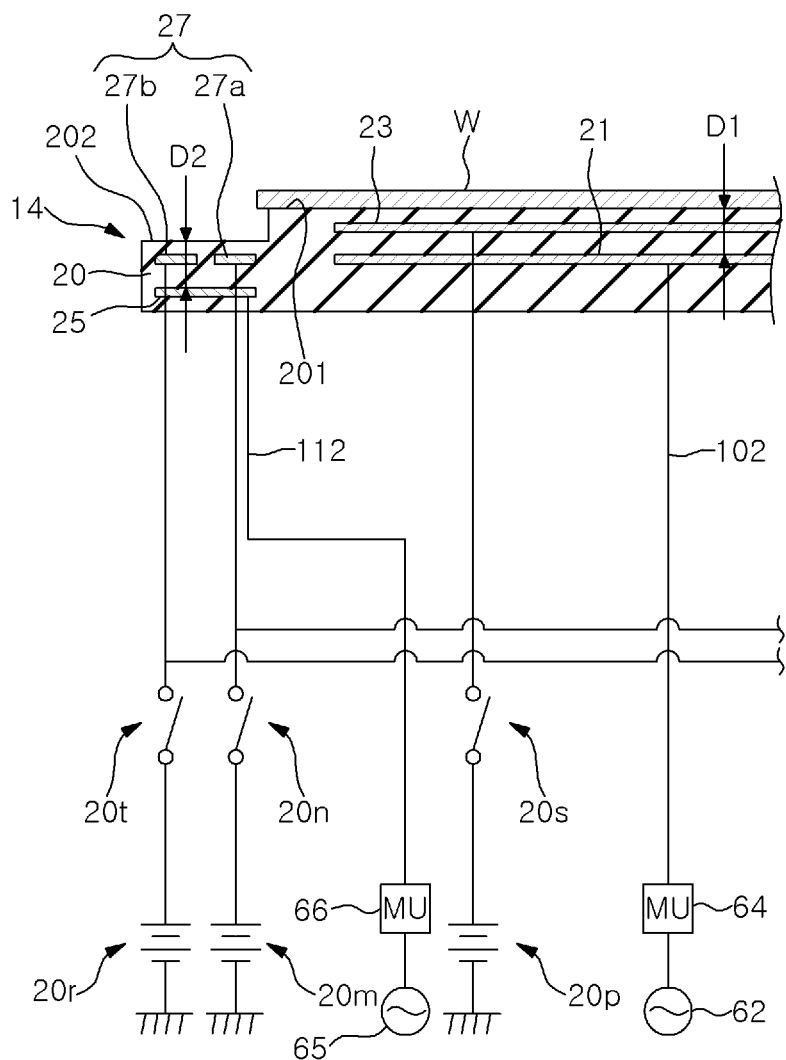
FIG. 3 shows an example of an electrical coupling between electrodes of the substrate support and power supplies according to an embodiment.

Hereinafter, the substrate support 14 according to the embodiment will be described in detail with reference to FIG. 2 and FIG. 3 in addition to FIG. 1. FIG. 2 shows an example of a structure of the substrate support 14 according to the embodiment. FIG. 3 shows an example of an electrical coupling between power supplies and electrodes of the substrate support 14 according to the embodiment.

The electrostatic chuck 20 includes a main body having a first region and a second region as shown in FIG. 2. The main body of the electrostatic chuck 20 has a stepped portion at an outer periphery thereof and is formed of a dielectric material such as alumina ($Al_2O_3$), aluminum nitride (AlN), or the like.

The first region has a substantially disk shape. The first region has a first substrate supporting surface 201 onto which the substrate W is placed. The first region is configured to attract and hold the substrate W placed onto the first substrate supporting surface 201. A diameter of the first region is smaller than that of the substrate W.

The second region has an annular shape. The second region shares a central axis (axis AX shown in FIG. 2) with the first region. The second region has a second substrate supporting surface 202. The second region is disposed as one body to surround the first region and configured to support the edge ring 26 placed onto the second substrate supporting surface 202 (see FIG. 1).

The dielectric material forming the first region may be the same as that forming the second region. For example, the main body of the electrostatic chuck 20 may be formed of ceramic such as aluminum oxide or aluminum nitride. The electrostatic chuck 20 has, as the substrate supporting surface, the first substrate supporting surface 201 and the second substrate supporting surface 202. The second substrate supporting surface 202 in the second region is lower than the first substrate supporting surface 201 in the first region. A thickness of the first region is greater than that of the second region.

The electrostatic chuck 20 further includes an attracting electrode 23. The attracting electrode 23 is disposed in the first region of the main body. The attracting electrode 23 is connected to a direct-current (DC) power supply 20p through a switch 20s (see FIGS. 1 and 3). When a DC voltage from the DC power supply 20p is applied to the attracting electrode 23, an electrostatic attraction force is generated between the first region of the main body and the substrate W. Due to the generated electrostatic attraction force, the substrate W is attracted to and held on the first region of the main body.

The electrostatic chuck 20 further includes attracting electrodes 27a and 27b (hereinafter, collectively referred to as "attracting electrode 27"). The attracting electrodes 27a and 27b are disposed in the second region of the main body. The attracting electrodes 27a and 27b circumferentially extend about the central axis of the electrostatic chuck 20. The attracting electrode 27b is disposed outside the attracting electrode 27a. As shown in FIG. 3, a DC power supply (DC) 20m is electrically coupled to the attracting electrode 27a through a switch 20n, and a DC power supply (DC) 20r is electrically coupled to the attracting electrode 27b through a switch 20t. DC voltages are applied from the DC power supplies 20m and 20r to the attracting electrodes 27a and 27b such that a potential difference is generated between the attracting electrodes 27a and 27b. For example, the polarity of the DC voltage applied from the DC power supply 20m to the attracting electrode 27a may be opposite to that of the DC voltage applied from the DC power supply 20r to the attracting electrode 27b. However, the attracting electrode 27 is not limited to a bipolar electrode and may be a monopolar electrode. When the DC voltages are applied from the DC power supplies 20m and 20r to the attracting electrodes 27a and 27b, an electrostatic attraction force is generated between the second region of the main body and the edge ring 26. Due to the generated electrostatic attraction force, the edge ring 26 is attracted to and held on the second region of the main body.

As shown in FIG. 3, the bias electrode 21 is disposed below the first substrate supporting surface 201 and below the attracting electrode 23. A bias electrode 25 is disposed below the second substrate supporting surface 202 and below the attracting electrodes 27a and 27b. A third RF power supply 65 is electrically coupled to the bias electrode 25 connected to a power supply line 112 through a matching unit (MU) 66 (see FIGS. 1 and 2). The matching unit 66 has a matching circuit. The matching circuit of the matching unit 66 is configured to match an impedance of a load side (the lower electrode side) of the third RF power supply 65 and an output impedance of the third RF power supply 65.

Each of the bias electrodes 21 and 25 is disposed to provide a bias power for ion attraction. A DC voltage or a RF voltage is applied to be the bias power. In the example of FIGS. 1 and 2, the bias electrode 25 provides the bias power by applying a RF power from the third RF power supply 65. However, the present disclosure is not limited thereto, and the bias power may be provided by applying a DC voltage from the DC power supply. When the bias power is applied to the bias electrode 21, ions in the plasma are attracted toward the first region of the main body. Accordingly, the process characteristics, such as an etching rate, a film forming rate, and the like, on the entire surface of the substrate W can be controlled. When the bias power is applied to the bias electrode 25, the ions in the plasma are attracted toward the second region of the main body. Accordingly, the process characteristics on the edge region of the substrate W can be controlled.

The bias electrodes 21 and 25 are examples of an electrode disposed below the substrate supporting surface of the electrostatic chuck 20 to provide the bias power. The bias electrode 21 is an example of a first electrode disposed below the first substrate supporting surface 201, and the bias electrode 25 is an example of a second electrode disposed below the second substrate supporting surface 202. The bias powers applied to the bias electrodes 21 and 25 are independently controlled by the second RF power supply 62 and the third RF power supply 65, respectively. The electrode for providing the bias power may include at least one of the bias electrode 21 and the bias electrode 25.

The attracting electrode 23 in the first region is disposed between the first substrate supporting surface 201 and the bias electrode 21. The attracting electrode 23 and the bias electrode 21 are formed in a disk shape and have substantially the same diameter. The attracting electrodes 27a and 27b in the second region are disposed between the second substrate supporting surface 202 and the bias electrode 25. The attracting electrodes 27a and 27b and the bias electrode 25 have an annular shape. Radial widths of the attracting electrodes 27a and 27b are substantially the same, and a radial width of the bias electrode 21 is greater than the sum of the radial widths of the attracting electrodes 27a and 27b. The attracting electrodes 23, 27a, and 27b are examples of an electrode disposed between the electrode for providing the bias power and the substrate supporting surface of the electrostatic chuck 20 to generate an electrostatic attraction. The electrode for generating the electrostatic attraction may include at least one of the attracting electrodes 23 and 27. Accordingly, at least one of the substrate W and the edge ring 26 is electrostatically attracted and held. Further, the electrode for providing the bias power and the electrode for generating the electrostatic attraction are disposed in the same dielectric.

The bias electrode 21 and the attracting electrodes 27a and 27b are disposed on the same plane of the electrostatic chuck 20. As shown in FIG. 3, a thickness D1 from the first substrate supporting surface 201 shown in FIG. 2 to an upper surface of the bias electrode 21 is equal to a thickness D2 from the second substrate supporting surface 202 to an upper surface of the bias electrode 25.

When the RF power LF is applied to the electrode plate 16, a potential difference is generated between the electrode plate 16 and the substrate W depending on an electrostatic capacitance between the electrode plate 16 and the substrate W and a potential difference is generated between the electrode plate 16 and the edge ring 26 an electrostatic capacitance between the electrode plate 16 and the edge ring 26. Therefore, the heat transfer gas supplied to the back surface of the substrate W and a back surface of the edge ring 26 is ionized. Accordingly, abnormal discharge may occur on the back surface of the substrate W and/or the back surface of the edge ring 26. Hence, in the substrate support 14 according to the present embodiment, the bias electrodes 21 and 25 are disposed in the electrostatic chuck 20 to suppress the discharge of the heat transfer gas. As a result, the RF power LF can be applied to the bias electrodes 21 and 25.

(Contact Pin)

As shown in FIG. 2, the substrate support 14 includes a contact pin 100 that electrically couples the bias electrode 21 and the power supply line 102 that is disposed below the bias electrode 21 to apply a bias power. The contact pin 100 has a tapered shape such that an area of an upper surface 100a coupled to the bias electrode 21 is greater than that of a bottom surface 100b coupled to the power supply line 102. The contact pin 100 is formed of a conductive material. The contact pin 100 may be formed of, e.g., conductive ceramic. The power supply line 102 has at a tip end thereof a metal terminal 103 made of a metal material such as copper (Cu), titanium (Ti), or the like, and the contact pin 100 couples the bias electrode 21 and the metal terminal 103. Accordingly, the power supply line 102 is partially disposed in the substrate support 14, and a part (the metal terminal 103) of the power supply line 102 may be exposed on the bottom surface of the substrate support 14 (bottom surface 182 of the lower electrode 18). As a result, the RF power LF from the second RF power supply 62 is applied to the bias electrode 21 through the power supply line 102 (the metal terminal 103) and the contact pin 100.

Further, the substrate support 14 includes a contact pin 110 that electrically couples the bias electrode 25 and the power supply line 112 that is disposed below the bias electrode 25 to apply a bias power. The contact pin 110 has a tapered shape such that an area of an upper surface 110a coupled to the bias electrode 25 is greater than that of a bottom surface 110b coupled to the power supply line 112. The contact pin 110 is formed of a conductive material. The contact pin 110 may be formed of, e.g., conductive ceramic. The power supply line 112 has at a tip end thereof a metal terminal 113 made of a metal material, and the contact pin 110 couples the bias electrode 25 and the metal terminal 113. Accordingly, the power supply line 112 is partially disposed in the substrate support 14, and a part (the metal terminal 113) of the power supply line 112 may be exposed on the bottom surface of the substrate support 14 (the bottom surface 182 of the lower electrode 18). As a result, the RF power from the third RF power supply 65 is applied to the bias electrode 25 through the power supply line 112 (the metal terminal 113) and the contact pin 110.

The contact pins 100 and 110 are examples of a power supply terminal that electrically couples the electrode for providing the bias power and the power supply line.

Figure 4A:
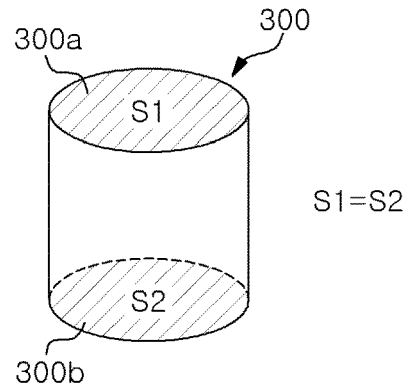
FIGS. 4A to 4C show examples of an electrode contact according to an embodiment.

The structural characteristics of the contact pin 100 according to the present embodiment shown in FIG. 4B will be described while comparing a shape of the contact pin 100 with that of a conventional contact pin 300 shown in FIG. 4A. Since the contact pin 110 has the same structural characteristics as the contact pin 100, the description thereof will be omitted.

The conventional contact pin 300 has a cylindrical shape, and an area S1 of its upper surface 300a is equal to an area S2 of its bottom surface 300b. When the RF bias power LF is supplied from the second RF power supply 62, a relatively high current flows through the contact pin 300 for a short period of time. Therefore, Joule heat is generated and the contact pin 300 emits heat. Accordingly, a temperature of a portion of the substrate W positioned above the contact pin 300 becomes higher than that of other portions of the substrate W, which makes it difficult to control the in-plane temperature distribution of the substrate W to be uniform.

Figure 4B:
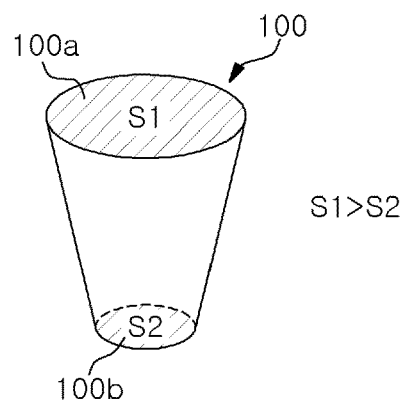

Therefore, the contact pin 100 according to the present embodiment has a tapered shape, and the area S1 of the upper surface 100a is greater than the area S2 of the bottom surface 100b as shown in FIG. 4B. By increasing the area S1 of the upper surface 100a of the contact pin 100, it is possible to reduce electric resistance on the upper surface 100a and to suppress the heat emission of the contact pin 100.

Further, by decreasing the area S2 of the bottom surface 100b of the contact pin 100, it is possible to reduce a diameter of a through-hole that is formed through the lower electrode 18 to allow the metal terminal 18 to penetrate therethrough. Further, the contact pin 100 is formed of a conductive material. Therefore, it is necessary to insulate the contact pin 100 from the lower electrode 18 formed of a metal. Accordingly, sleeve 101 (sleeve 111) made of an insulating material is inserted into the through-hole of the lower electrode 18. When a diameter of the through-hole is large, a horizontal distance P between the central axis (the axis AX in FIG. 2) and an upper end of the sleeve 101 becomes long. When the distance P becomes long, a circular insulating material with a diameter 2P is exposed on an upper surface 181 of the lower electrode 18. At the insulating material portion made of ceramic or the like, it is difficult to perform temperature control such as cooling through the internal flow channel 18f. Therefore, the area S2 of the bottom surface 100b of the contact pin 100 is decreased to prevent the temperature of the electrostatic chuck 20 from becoming non-uniform at the upper portion of the through-hole. Accordingly, an area where the insulating material is exposed on the upper surface 181 of the lower electrode 18 can be minimized, and the in-plane uniformity of the substrate temperature can be improved.

In particular, a relatively high current of several amperes to 10 amperes instantaneously flows through the bias electrode 21 due to discharge between the bias electrode 21 and the generated plasma. During plasma processing, an AC current flows through the bias electrode 21 and is repeatedly switched ON and OFF depending on the frequency of the RF power LF. A relatively high current instantaneously flows when the AC current is switched from ON to OFF or from OFF to ON. Accordingly, Joule heat is periodically generated and the contact pin 300 emits heat.

Further, a DC current that is not relatively high compared to the current that flows through the bias electrode 21 flows through each of the attracting electrode 23 (the attracting electrodes 27a and 27b). Therefore, the contact pin 100 (the contact pin 110) according to the present embodiment is preferably used particularly as the power supply terminal of the bias electrode 21 (the bias electrode 25), and is not necessarily used as the power supply terminal of the attracting electrodes 23 (the attracting electrodes 27a and and 27b).

Figure 4C:
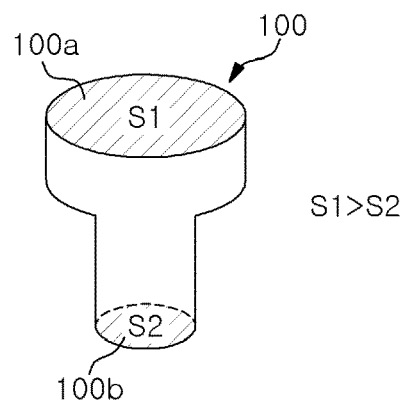

The contact pin 100 (the contact pin 110) do not necessarily have a tapered shape. For example, as shown in FIG. 4C, each of the contact pins 100 and 110 may have a stepped side surface such that the area S1 of the upper surface 100a is greater than the area S2 of the bottom surface 100b. By increasing the area S1 of the upper surface 100a of the contact pin 100, it is possible to reduce the electric resistance on the upper surface 100a and to suppress the heat emission of the contact pin 100. This is also applied to the contact pin 110.

Figure 5:
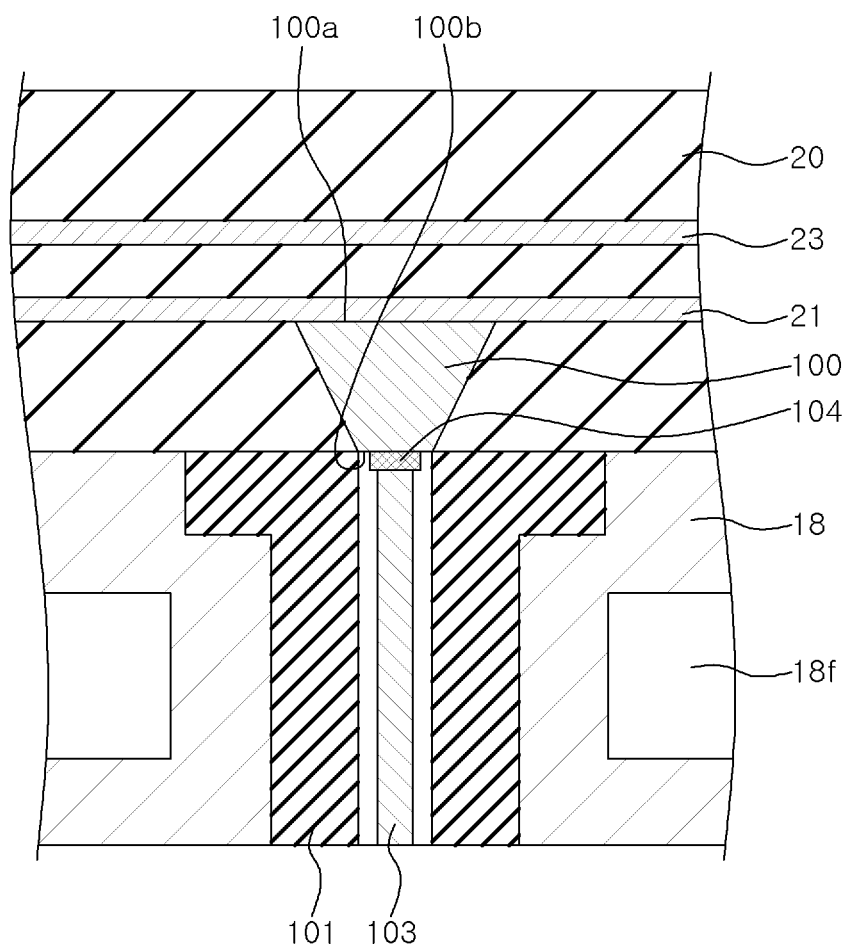
FIG. 5 shows another example of the electrode contact according to the embodiment.

Further, as shown in FIG. 5, a metal plate 104 may be disposed between the contact pin 100 and the metal terminal 103. The metal plate 104 is formed of a conductive material such as aluminum or the like. In this case, the metal plate 104 is bonded (soldered) to the bottom surface of the contact pin 100 with a conductive adhesive, and the metal terminal 103 is pressed against the metal plate 104. This is also applied to the contact pin 110.

In the contact structure of FIG. 2, the metal terminal 103 is directly pressed against the bottom surface 100b of the contact pin 100. Here, the contact resistance increases at the interface between the contact pin 100 and the metal terminal 103. On the other hand, in the contact structure of FIG. 5, the contact pin 100 and the metal terminal 103 are brought into contact with each other via the metal plate 104. Accordingly, the contact resistance at the contact pin 100 can be decreased, and the heat emission of the contact pin 100 can be suppressed.

(Electrodes)

Next, electrodes embedded in the electrostatic chuck 20 will be described with reference to FIGS. 6A to 6C. FIG. 6A shows a VIA-VIA cross section of the electrostatic chuck 20 shown in FIG. 2. FIG. 6B shows a VIB-VIB cross section of the electrostatic chuck 20 shown in FIG. 2. FIG. 6C shows a VIC-VIC cross section of the electrostatic chuck 20 shown in FIG. 2.

Referring to the VIA-VIA cross section of FIG. 6A, the disk-shaped attracting electrode 23 is disposed in the first region. The attracting electrode 23 is a film-shaped electrode or a sheet-shaped electrode.

Referring to the VIB-VIB cross section of FIG. 6B, the annular attracting electrodes 27a and 27b are disposed in the second region. Each of the attracting electrodes 27a and 27b is a film-shaped electrode or a sheet-shaped electrode. The attracting electrode 27b is disposed outside the attracting electrode 27a.

Further, the disk-shaped bias electrode 21 is disposed in the first region. The bias electrode 21 has a sheet shape or a mesh shape. The bias electrode 21 is formed of conductive ceramic containing a metal and ceramic used for the electrostatic chuck 20.

The material of the bias electrode 21 may be, but not limited to, conductive ceramic obtained by combining a refractory metal such as tungsten, tantalum, molybdenum, or the like and ceramic used for the electrostatic chuck 20. The bias electrode 21 may have a resistance value lower than or equal to a predetermined value (e.g., 0.1 Ω·cm). The bias electrode 21 is in contact with the contact pin 100 at the center thereof.

Referring to the VIC-VIC cross section of FIG. 6C, the annular bias electrode 25 is disposed in the second region. The bias electrode 25 is a sheet-shaped electrode or a mesh-shaped electrode. In the bias electrode 25, power supply terminals 25a are arranged at equal intervals in a circumferential direction. Each of the power supply terminals 25a is coupled to the contact pin 110. Accordingly, the contact pins 110 coupled to the bias electrode 25 are arranged at equal intervals in the circumferential direction of the edge ring 26. As a result, the impedance of the RF power LF can become uniform in the circumferential direction, and the variation of the RF power LF in the circumferential direction can be suppressed.

The bias electrode 25 has a sheet shape or a mesh shape. The bias electrode 25 is formed of conductive ceramic containing a metal and ceramic used for the electrostatic chuck 20.

The bias electrode 25 has a resistance value lower than or equal to a predetermined value (e.g., 0.1 Ω·cm). The material of the bias electrode 25 may be, but not limited to, conductive ceramic obtained by combining a refractory metal material such as tungsten, tantalum, molybdenum, or the like and ceramic used for the electrostatic chuck 20.

Further, the bias electrode 25 may be a mesh-shaped metal rather than a sheet-shape metal. In this case, it is possible to reduce the difference in contraction between the bias electrode 25 and the electrostatic chuck 20, which is caused by a difference in linear expansion coefficients between the bias electrode 25 and the electrostatic chuck 20 due to heat input from the plasma, and the friction between the bias electrode 25 and the electrostatic chuck 20 also can be reduced.

As described above, in accordance with the substrate support 14 and the plasma processing apparatus 1 of the present embodiment, the bias electrodes 21 and 25 are disposed in the electrostatic chuck 20 to suppress discharge of the heat transfer gas supplied to the space between the back surface of the substrate W and the upper surface of the electrostatic chuck 20.

Further, the contact pin, which electrically couples the electrode for providing the bias power and the power supply line, has a shape in which the area of the surface of the contract pin that is coupled to the electrode is greater than the area of the surface of the contract pin that is coupled to the power supply line. Accordingly, it is possible to suppress heat generated at the contact pin and its vicinity, and to improve the in-plane uniformity of the substrate temperature.

The substrate support and the plasma processing apparatus according to the embodiments of the present disclosure are considered to be illustrative in all respects and not restrictive. The above-described embodiments may be changed or modified in various forms without departing from the scope of the appended claims and the gist thereof. The above-described embodiments may include other configurations without contradicting each other and may be combined without contradicting each other.

The plasma processing apparatus of the present disclosure can be applied to any apparatus using atomic layer deposition (ALD), capacitively coupled plasma (CCP), inductively coupled plasma (ICP), a radial line slot antenna (RLSA), electron cyclotron resonance plasma (ECR), helicon wave plasma (HWP), or the like. Further, the plasma processing apparatus may be any apparatus that performs predetermined processing (e.g., etching, film formation, or the like) on the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A substrate support, comprising:
a base disposed in a chamber; and
an electrostatic chuck disposed on an upper part of the base, the electrostatic chuck having a first substrate supporting surface for placing thereon a substrate, and a second substrate supporting surface for placing thereon an edge ring disposed to surround the substrate;
wherein the electrostatic chuck includes:
a first attracting electrode disposed below the first substrate supporting surface;
a first bias electrode disposed below the first attracting electrode, wherein the first attracting electrode and the first bias electrode are both located below the second substrate supporting surface;
two second attracting electrodes disposed below the second substrate supporting surface and formed on a plane coplanar with the first bias electrode;
a second bias electrode disposed below the two second attracting electrodes, and the second bias electrode has a width equal to a difference between an outer diameter of an outermost second attracting electrode of the two second attracting electrodes and an inner diameter of an innermost second attracting electrode of the two second attracting electrodes; and
a first power supply terminal filled in the electrostatic chuck and electrically connected to the first bias electrode;
wherein the first power supply terminal has a first upper surface electrically connected to the first bias electrode, and a first bottom surface having an area smaller than an area of the first upper surface,
the first bottom surface is electrically connected to an upper surface of a power supply line on a plane coplanar with a bottom surface of the electrostatic chuck, and an area of the first bottom surface is larger than an area of the upper surface of the power supply line, and
the first power supply terminal has a tapered shape such that an area of a cross-section of the first power supply terminal gradually decreases and a side wall of the first power supply terminal extends obliquely, from the first upper surface connected to the first bias electrode, toward the first bottom surface connected to the power supply line.

2. The substrate support of claim 1, wherein the electrostatic chuck includes at least one second power supply terminal filled in the electrostatic chuck and electrically connected to the second bias electrode;
wherein the at least one second power supply terminal has a second upper surface electrically connected to the second bias electrode and a second bottom surface having an area smaller than an area of the second upper surface, and
the second bottom surface is electrically connected to the power supply line on the plane coplanar with the bottom surface of the electrostatic chuck.

3. The substrate support of claim 2, wherein a plurality of the second power supply terminals are arranged at equal intervals in a circumferential direction of the edge ring.

4. The substrate support of claim 3, wherein the plurality of the second power supply terminals have a tapered shape.

5. The substrate support of claim 2, wherein the at least one second power supply terminal has a tapered shape.

6. The substrate support of claim 2, wherein the second attracting electrodes are bipolar electrodes.

7. The substrate support of claim 2, wherein a metal plate is disposed between the at least one second power supply terminal and a second power supply line.

8. The substrate support of claim 1, wherein a metal plate is disposed between the first power supply terminal and the power supply line.

9. A substrate support, comprising:
a base disposed in a chamber; and
an electrostatic chuck disposed on an upper part of the base, the electrostatic chuck having a first substrate supporting surface for placing thereon a substrate, and a second substrate supporting surface for placing thereon an edge ring disposed to surround the substrate;
wherein the electrostatic chuck includes:
a first attracting electrode disposed below the first substrate supporting surface;
a first bias electrode disposed below the first attracting electrode, wherein the first attracting electrode and the first bias electrode are both located below the second substrate supporting surface;
two second attracting electrodes disposed below the second substrate supporting surface and formed on a plane coplanar with the first bias electrode;
a second bias electrode disposed below the two second attracting electrodes, and the second bias electrode has a width equal to a difference between an outer diameter of an outermost second attracting electrode of the two second attracting electrodes and an inner diameter of an innermost second attracting electrode of the two second attracting electrodes; and
a first power supply terminal filled in the electrostatic chuck and electrically connected to the first bias electrode;
wherein the first power supply terminal has a first upper surface electrically connected to the first bias electrode, and a first bottom surface having an area smaller than an area of the first upper surface,
the first bottom surface is electrically connected to an upper surface of a power supply line on a plane coplanar with a bottom surface of the electrostatic chuck, and
the first power supply terminal has a tapered shape such that an area of a cross-section of the first power supply terminal gradually decreases and a side wall of the first power supply terminal extends obliquely, from the first upper surface connected to the first bias electrode, toward the first bottom surface connected to the power supply line.

10. A plasma processing apparatus comprising:
a chamber;
a base disposed in the chamber;
an electrostatic chuck disposed on an upper part of the base, the electrostatic chuck having a first substrate supporting surface for placing thereon a substrate, and a second substrate supporting surface for placing thereon an edge ring disposed to surround the substrate; and a power supply line, wherein the electrostatic chuck includes:

a first attracting electrode disposed below the first substrate supporting surface;

a first bias electrode disposed below the first attracting electrode, wherein the first attracting electrode and the first bias electrode are both located below the second substrate supporting surface;

two second attracting electrodes disposed below the second substrate supporting surface and formed on a plane coplanar with the first bias electrode;

a second bias electrode disposed below the two second attracting electrodes, and the second bias electrode has a width equal to a difference between an outer diameter of an outermost second attracting electrode of the two second attracting electrodes and an inner diameter of an innermost second attracting electrode of the two second attracting electrodes; and a first power supply terminal filled in the electrostatic chuck and electrically connected to the first bias electrode;

wherein the first power supply terminal has a first upper surface electrically connected to the first bias electrode, and a first bottom surface having an area smaller than an area of the first upper surface, the first bottom surface is electrically connected to an upper surface of the power supply line on a plane coplanar with a bottom surface of the electrostatic chuck, and an area of the first bottom surface is larger than an area of the upper surface of the power supply line, and the first power supply terminal has a tapered shape such that an area of a cross-section of the first power supply terminal gradually decreases and a side wall of the first power supply terminal extends obliquely, from the first upper surface connected to the first bias electrode, toward the first bottom surface connected to the power supply line.

11. The plasma processing apparatus of claim 10, wherein the electrostatic chuck includes at least one second power supply terminal filled in the electrostatic chuck and electrically connected to the second bias electrode;

wherein the at least one second power supply terminal has a second upper surface electrically connected to the second bias electrode and a second bottom surface having an area smaller than an area of the second upper surface, and the second bottom surface is electrically connected to the power supply line on the plane coplanar with the bottom surface of the electrostatic chuck.

12. The plasma processing apparatus of claim 11, wherein a plurality of the second power supply terminals are arranged at equal intervals in a circumferential direction of the edge ring.

13. The plasma processing apparatus of claim 12, wherein the plurality of the second power supply terminals have a tapered shape.

14. The plasma processing apparatus of claim 11, wherein the at least one second power supply terminal has a tapered shape.

15. The plasma processing apparatus of claim 11, wherein the second attracting electrodes are bipolar electrodes.

16. The plasma processing apparatus of claim 11, wherein a metal plate is disposed between the at least one second power supply terminal and a second power supply line.

17. The plasma processing apparatus of claim 10, wherein a metal plate is disposed between the first power supply terminal and the power supply line.

* * * * *